United States Patent [19]

Matsumoto

[11] Patent Number: 5,110,763

[45] Date of Patent: May 5, 1992

[54] PROCESS OF FABRICATING MULTI-LEVEL WIRING STRUCTURE, INCORPORATED IN SEMICONDUCTOR DEVICE

[75] Inventor: Yasuhiko Matsumoto, Shizuoka, Japan

[73] Assignee: Yamaha Corporation, Hamamatsu, Japan

[21] Appl. No.: 643,891

[22] Filed: Jan. 22, 1991

[30] Foreign Application Priority Data

Jan. 29, 1990 [JP] Japan .................................. 2-18447

[51] Int. Cl.$^5$ ...................... H01L 21/44; H01L 21/48
[52] U.S. Cl. ................................. 437/195; 437/982; 148/DIG. 133
[58] Field of Search .... 437/195, DIG. 133, DIG. 982

[56] References Cited

FOREIGN PATENT DOCUMENTS

| | | | |
|---|---|---|---|
| 60-173856 | 9/1985 | Japan | 437/195 |
| 61-196555 | 8/1986 | Japan | 437/195 |
| 61-260638 | 11/1986 | Japan | 437/195 |
| 63-142 | 1/1988 | Japan | . |
| 63-155625 | 6/1988 | Japan | 437/195 |
| 2-26054 | 1/1990 | Japan | 437/195 |
| 2-174250 | 7/1990 | Japan | . |

OTHER PUBLICATIONS

"Semicon News 1988.7", pp. 72-77.

Primary Examiner—Robert Kunemund
Assistant Examiner—David E. Graybill
Attorney, Agent, or Firm—Burns, Doane, Swecker & Mathis

[57] ABSTRACT

A process of fabricating a multi-level wiring structure starts with preparation of a semiconductor substrate covered with a lower insulating film, and comprises the steps of forming lower-level wiring strips on the lower insulating film, covering the lower-level wiring strips and exposed portions of the lower insulating film with a first intermediate insulating film, coating the entire surface with an organic glass film, removing the organic film except for pieces of the organic glass film in valleys between the lower-level wiring strips, coating the entire surface with an inorganic glass film, removing the inorganic glass film except for pieces of the inorganic glass film on the pieces of the organic glass film, covering the entire surface with a second intermediate insulating film, and forming upper-level wiring strips on the intermediate insulating film, wherein the pieces of the inorganic glass film prevent the upper-level wiring strips from corrosion due to water vapor produced from the pieces of the organic glass film.

16 Claims, 8 Drawing Sheets

PROCESS OF FABRICATING MULTI-LEVEL WIRING STRUCTURE, INCORPORATED IN SEMICONDUCTOR DEVICE

FIELD OF THE INVENTION

This invention relates to a semiconductor device and, more particularly, to a process of fabricating a multi-level wiring structure incorporated in the semiconductor device.

DESCRIPTION OF THE RELATED ART

Various multi-level wiring structures are employed in a semiconductor device for fabricating a large scale integration. The multi-level wiring decreases the amount of the real estate of a semiconductor chip occupied and promotes the integration density. In fact, a high speed circuit and a multiple function device are not feasible without the multi-level wiring structure and the scaling down technology. Moreover, the multi-level wiring structure is indispensable for some custom made integrated circuits such as, gate arrays, because the multi-level wiring structure surely shrinks a time schedule for developing a new function. A modification of upper level wirings results in a new custom made integrated circuit.

One of the important features of the multi-level wiring structure is conformal step coverage. A non-conformal step coverage of the lower-level wiring is causative of various undesirable troubles such as disconnections of an upper-level wiring strip, and such an undesirable non-conformal step coverage tends to take place at a sharp step portion of the inter-level insulating film between the lower-level wiring strip and the upper-level wiring strip.

Various approaches have been proposed for the conformal step coverage, and one of the attractive approaches is filling up a valley between adjacent lower-level wiring strips with glass which in turn covered with an insulating film for providing a smooth surface. The glass film is formed of either organic or inorganic glass, and the organic and inorganic glasses are of silanol compound.

The prior art process sequence is described hereinbelow with reference to FIGS. 1A to 1D. Referring first to FIG. 1A of the drawings, a silicon substrate 1 is covered with a lower-level silicon oxide film 2. On the lower-level silicon oxide film 2 is patterned lower-level wiring strips 3a, 3b and 3c which are covered with a silicon oxide film 4. The silicon oxide film 4 is deposited on the entire surface of the structure through a chemical vapor deposition technique. The silicon oxide film 4 is not uniform in thickness and, accordingly, does not have the conformal step coverage. The poor step coverage is improved by using an inorganic glass as described hereinbelow.

A glass solution is prepared by mixing an inorganic glass into a solvent and spun onto the entire surface of the structure. The inorganic glass is represented by the formula of $Si(OH)_4$ in this prior art process. The glass solution thus spun onto the structure is baked so that an inorganic glass film 5 covers the inter-level insulating film 4. A valley between the lower-level wiring strips 3b and 3c is completely filled with the inorganic glass film 5. However, the inorganic glass film 5 is hardly merged with each other in a valley between the lower-level wiring strips 3a and 3b, and a small crack 6 tends to take place as shown in FIG. 1B.

The inorganic glass film 5 is, then, removed until the silicon oxide film 4 is exposed through an etch-back process leaving bulks 7a, 7b, 7c and 7d of the inorganic glass in the valleys as shown in FIG. 1C. Silicon oxide is deposited on the entire surface of the structure by using the chemical vapor deposition technique so that a silicon oxide film 8 is formed on the structure. The silicon oxide films 4 and 8 and the bulks 7a to 7d of the inorganic glass form in combination an inter-level insulating film structure 9, and the bulks 7a to 7d of the inorganic glass is expected to improve the step coverage of the inter-level insulating layer 9. Though not shown in the drawings, contact holes are formed in the silicon oxide films 4 and 8, and upper-level metal wiring strips (not shown) are patterned and coupled through the contact holes to the lower level wiring strips 3a to 3c.

However, a problem is encountered in the prior art process in that a disconnection still takes place in the upper-level metal wiring strip In detail, the glass solution comes in a narrow valley between adjacent lower-level wiring strips due to the capillary phenomenon and fills in the narrow valley. While baking the glass solution, internal stress is exerted on the inorganic glass film 5 in the narrow valley, and the crack 6 is produced in the inorganic glass film 5. This is because of the fact that the inorganic glass film 5 in the narrow valley hardly absorbs the internal stress. The crack 6 widens out through the etch-back stage, and the gap 6a takes place in the inorganic glass film 5. The gap 6a is causative of a crack 9 in the silicon oxide film 8, and the crack 9 disconnects the upper-level metal wiring strip. The problem becomes serious in ultra large scale integrations, because a distance between adjacent lower-level wiring strips is decreased in reverse to the integration density. An ultra large scale integrated circuit is usually designed on a submicron design rule, and the crack 6 is much liable to take place due to the internal thermal stress.

If the inorganic glass film is replaced with an organic glass represented by the general formula of $R_nSi(OH)_{4-n}$ where R stands for $-CH_3$, $-C_6H_5$ or $-C_2H_5$, the internal stress is decreased as reported in "Semiconductor News", July, 1988, pages 72 to 77. In fact, after the organic glass is baked at 400 to 500 degrees in centigrade, the internal stress is so small that a crack hardly takes place. However, the organic glass is more liable to produce undesirable water vapor and corrosive organic gas, and upper-level metal wirings are attacked by the water vapor as well as the corrosive organic gas. In other words, the organic glass deteriorates the reliability of the metal wiring strips. If no residual organic glass is left on the higher portions of the silicon oxide film 4, the corrosion of the metal wirings is effectively suppressed. For this reason, the etch-back stage should be continued over the time period for the inorganic glass film 5, but such an over-etching decreases blocks of the organic glass in the valleys. This results in poor conformal step coverage. Thus, there is a trade-off between the reliability of the upper-level metal wiring strips and the conformal step coverage. A protection technique against the corrosion is disclosed in Japanese Patent Application laid-open (Kokai) No. 63-142.

SUMMARY OF THE INVENTION

It is therefore an important object of the present invention to provide a process of fabricating a multi-level wiring structure which improves the step coverage without sacrifice of the reliability of upper-level metal wiring strips.

To accomplish these objects, the present invention proposes to cover blocks of an organic glass with inorganic glass films, respectively.

In accordance with one aspect of the present invention, there is provided a process of fabricating a multi-level wiring structure on a semiconductor substrate covered with a lower insulating film, comprising the steps of: a) forming lower-level wiring strips on the lower insulating film; b) covering the lower-level wiring strips and exposed portions of the lower insulating film with a first intermediate insulating film, valleys being formed between the lower-level wiring strips; c) coating the entire surface with an organic glass film, the valleys being filled with the organic glass film; d) removing the organic glass film except for pieces of the organic glass film in the valleys; e) coating the entire surface with an inorganic glass film; f) removing the inorganic glass film except for pieces of the inorganic glass film on the pieces of the organic glass film; g) covering the entire surface with a second intermediate insulating film; and h) forming upper-level wiring strips on the second intermediate insulating film.

In accordance with another aspect of the present invention there is provided a process of fabricating a multi-level wiring structure on a semiconductor substrate covered with a lower insulating film, comprising the steps of: a) forming lower-level wiring strips on the lower insulating film; b) covering the lower-level wiring strips and exposed portions of the lower insulating film with a first intermediate insulating film, valleys being formed between the lower-level wiring strips; c) coating the entire surface with an organic glass film, the valleys being filled with the organic glass film; d) removing the organic glass film except for pieces of the organic glass film in the valley; e) covering the entire surface with a second intermediate insulating film, recesses being formed in the second intermediate insulating film within the valleys; f) coating the entire surface with an inorganic glass film; g) removing the inorganic glass film except for pieces of the inorganic glass film in the recesses; h) covering the entire surface with a third intermediate insulating film; and i) forming upper-level wiring strips on the third intermediate insulating film.

BRIEF DESCRIPTION OF THE DRAWINGS

The features and advantages of a process of fabricating a multi-level wiring structure according to the present invention will be more clearly understood from the following description taken in conjunction with the accompanying drawings in which.

DESCRIPTION OF THE PREFERRED EMBODIMENTS

First Embodiment

Figure 1A:
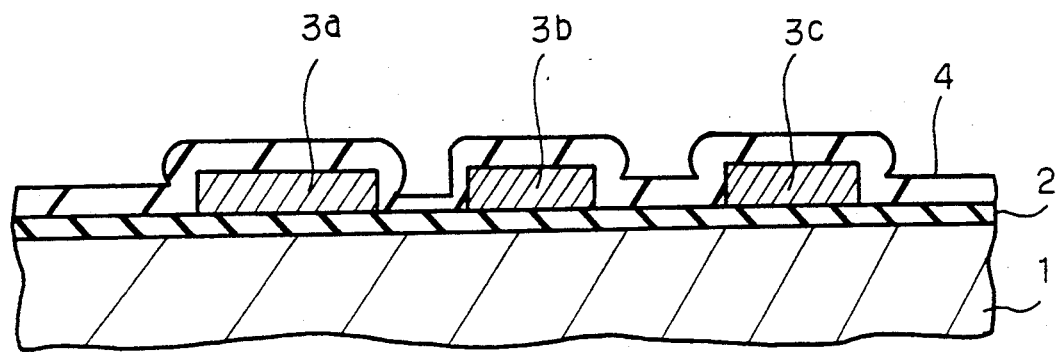
FIGS. 1A to 1D are cross sectional views showing the sequence of a prior art process of fabricating a multi-level wiring structure.
Figure 1B:
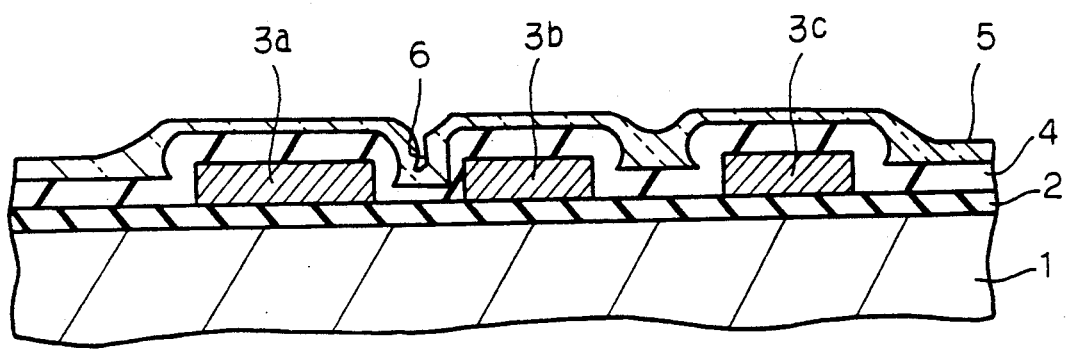
Figure 1C:
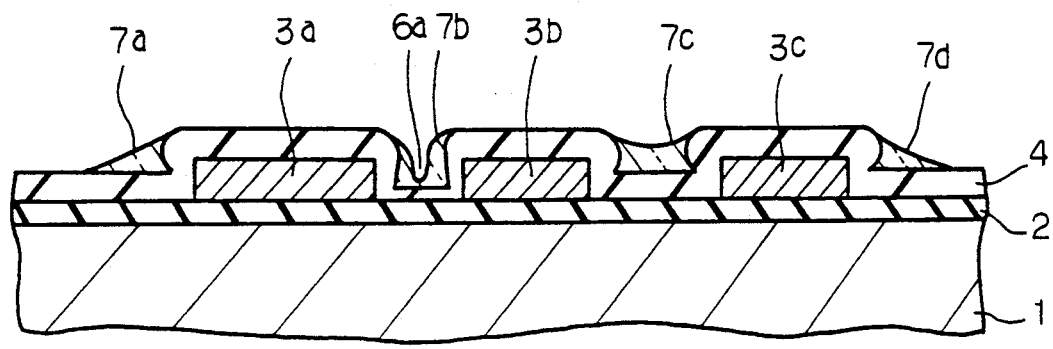
Figure 1D:
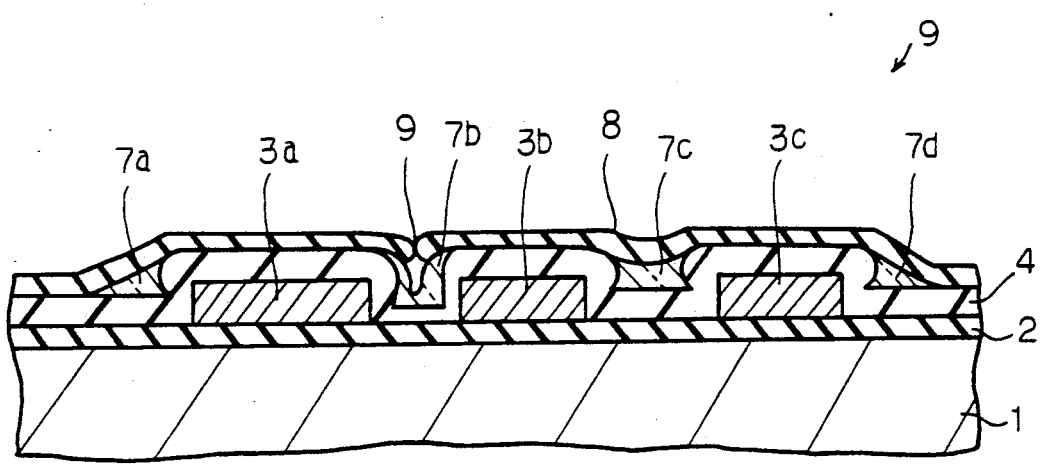
Figure 2A:
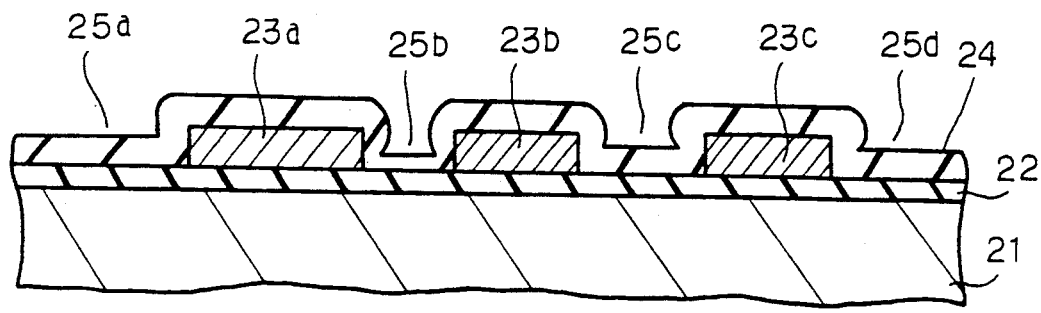
FIGS. 2A to 2H are cross sectional views showing the sequence of a process of fabricating a multi-level wiring structure according to the present invention.

A process sequence embodying the present invention starts with preparation of a single crystalline silicon substrate 21, and the major surface of the silicon substrate 21 is covered with a lower silicon oxide film 22. Though not shown in the drawings, various circuit component elements such as, for example, transistors and resisters are fabricated on the silicon substrate 21. On the lower silicon oxide film 22 are patterned a plurality of lower-level wiring strips including wiring strips 23a, 23b and 23c which are formed of an aluminum-copper alloy. Namely, the aluminum-copper alloy is deposited on the lower silicon oxide film 22 to a thickness of about 0.6 micron, and the aluminum-copper alloy film is patterned through a lithographic process. In this instance, the gap between the wiring strips 23a and 23b is narrower than the gap between the wiring strips 23b and 23c. Subsequently, a silicon oxide film 24 is deposited on the entire surface of the structure to a thickness of about 0.4 micron by using a plasma-asisted chemical vapor deposition technique, and, accordingly, the lower-level wiring strips 23a to 23c are covered with the silicon oxide film 24. The silicon oxide film 24 does not have a conformal step coverage and forms valleys 25a, 25b, 25c and 25d between the lower-level wiring strips. The valley 25c is located between the lower-level wiring strips 23b and 23c and has a relatively wide gap. However, the valley 25b between the wiring strips 23a and 23b has a relatively narrow gap and, for this reason, is deeper than the valley 25c as will be seen from FIG. 2A.

Figure 2B:
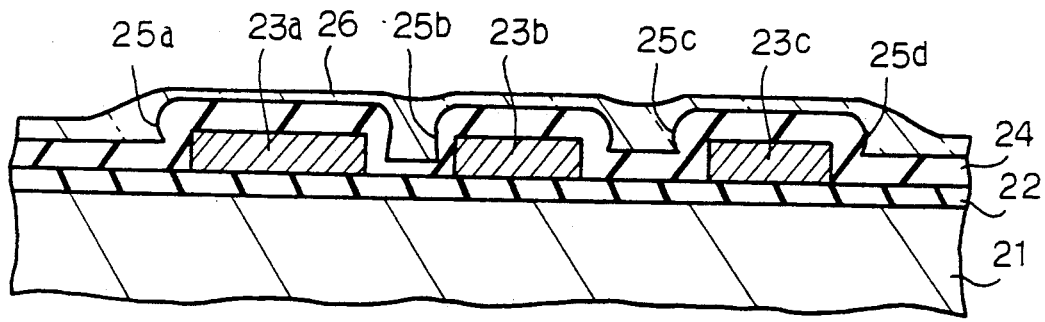

An organic glass solution is prepared by mixing an organic glass such as, for example, $R_nSi(OH)_{4-n}$ into a solvent, and R stands for $-CH_3$, $-C_6$, $-C_2H_5$ in the general formula. The organic glass solution is spun onto the entire surface of the structure, and an organic glass solution covers the silicon oxide film 24. Of course, the valleys 25a to 25d are filled with the organic glass solution as shown in FIG. 2B. The silicon substrate 21 is, then, placed in a nitrogen ambience, and the organic glass solution is baked at about 400 degrees in centigrade for about 30 minutes, thereby being formed into an organic glass film 26. The revolution in the spin-coating and the density of the organic glass solution are selected in such a manner that the thickness of the organic glass film 26 is of the order of 0.3 micron in wide flat areas where no lower-level wiring strip extends. The valley 25a is one of the wide flat areas. While the organic glass solution is baked, internal stress takes place in the organic glass film 26. However, the internal stress is negligible in comparison with the inorganic glass film 5, and, for this reason, a crack is seldom produced in the organic glass film 26.

Figure 2C:
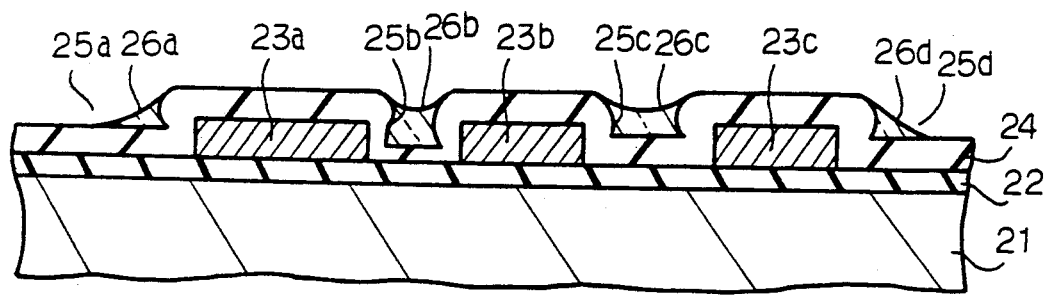

The organic glass film 26 is removed by using an etch-back technique until the silicon oxide film 24 is exposed. The etching proceeds over the endpoint in this etch-back stage, because the organic glass film 26 should be perfectly removed from that area over the lower-level wiring strips 23a to 23c. Such an excess etching prevents upper-level wirings from corrosion due to residual organic glass. Even though the residual organic glass over the lower-level wiring strips 23a to 23c is removed through excess etching, bulks of the organic glass 26a, 26b, 26c and 26d are left on the side surfaces of the wide valleys 25a and 25d as well as in the narrow valleys 25b and 25c as shown in FIG. 2C. Shallow recesses take place in the respective bulks 26b and 26c due to the excess etching.

The excess etching surely makes the silicon oxide film 24 over the lower-level wiring strips 23a to 23c clean. However, if a piece of the organic glass is unfortunately left on the silicon oxide film 24 over the lower-level wiring strips 23a to 23c, the piece of the organic glass is causative of the corrosion. In order to provide a perfect inter-level insulating structure free from the residual organic glass, a refining stage is carried out in an oxygen plasma. Namely, structure shown in FIG. 2C is exposed to an oxygen plasma, and the residual organic glass is refined therewith. Although the refining mechanism has not been perfectly analyzed, contact holes cleaned through the refining stage surely improve the reliability of inter-level wiring strips, and, for this reason, it is sure that the refining stage is effective against the residual organic glass. The methyl radicals in the organic glass may react with active oxygen atoms in the plasma, thereby allowing the organic glass to be refined into an oxide film without the methyl radicals. The effect of the refining stage is clear on a thin organic film, however, a thick organic film is hardly refined in the presence of the oxygen plasma. Upon completion of the etch-back stage, any residual organic film is thin enough to be refined with the oxygen plasma, and, for this reason, the refining stage is carried out after the etch-back stage.

Figure 2D:
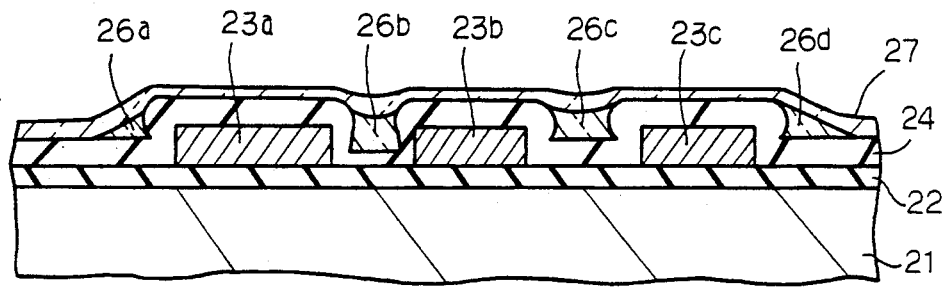

An inorganic glass solution is prepared by mixing $Si(OH)_4$ into a solvent, and the inorganic glass solution is spun onto the entire surface of the structure. The inorganic glass solution is baked in a nitrogen ambience at about 400 degrees in centigrade for about 30 minutes, and an inorganic glass film 27 is formed on the silicon oxide film 24 and the bulks of the organic glass 26a to 26d. The revolution in the spin-coating and the density of the silanol compound are selected in such a manner that the inorganic glass film 27 is as thick as about 0.14 micron over the flat areas. The resultant structure of this stage is shown in FIG. 2D.

Figure 2E:
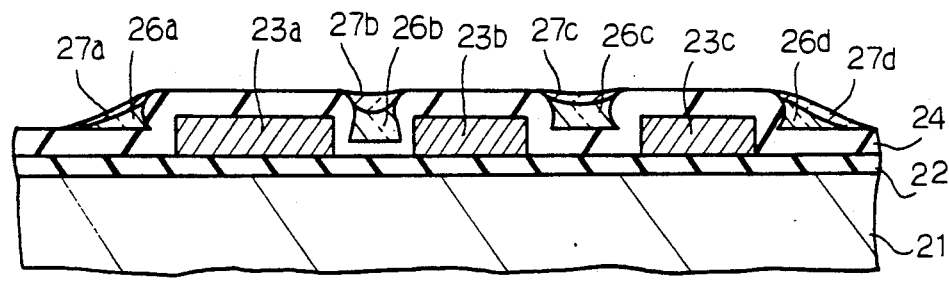

The inorganic glass film 27 is removed by using the etch-back technique until the silicon oxide film 24 over the lower-level wiring strips 23a to 23c are exposed. However, pieces of the inorganic glass 27a, 27b, 27c and 27d are left on the bulks of the organic glass 26a to 26d, respectively. The inorganic glass is less corrosive in comparison with the organic glass, and the etching can be terminated before the endpoint. In other words, the residual inorganic glass over the lower-level wiring strips has no serious influence on upper-level wiring strips. For this reason, any excess etching is not carried out on the inorganic glass film 28, and a smooth top surface extends over the pieces of the inorganic glass 27b and 27c as shown in FIG. 2E. The bulks 26a and 26d coated with the pieces of the inorganic glass 27a and 27d form gentle slopes, and no sharp step takes place in the structure.

Figure 2F:
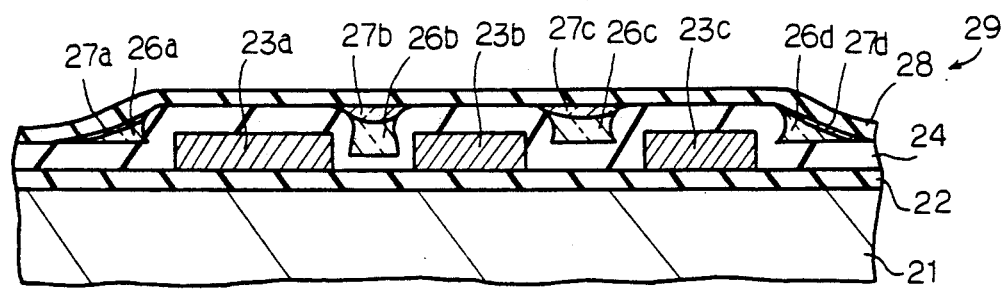

A silicon oxide film 28 is deposited to a thickness of about 0.3 micron by using a plasma-assisted chemical vapor deposition technique, and the resultant structure of this stage is shown in FIG. 2F. The silicon oxide films 24 and 28, the bulks of the organic glass 26a to 26d and the pieces of the inorganic glass 27a to 27d as a whole constitute an inter-level insulating film structure 29.

Figure 2G:
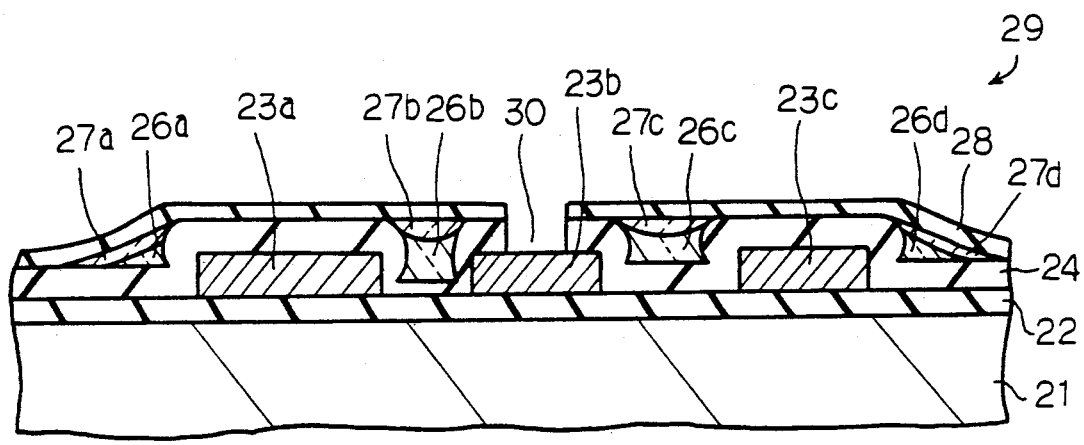
Figure 2H:
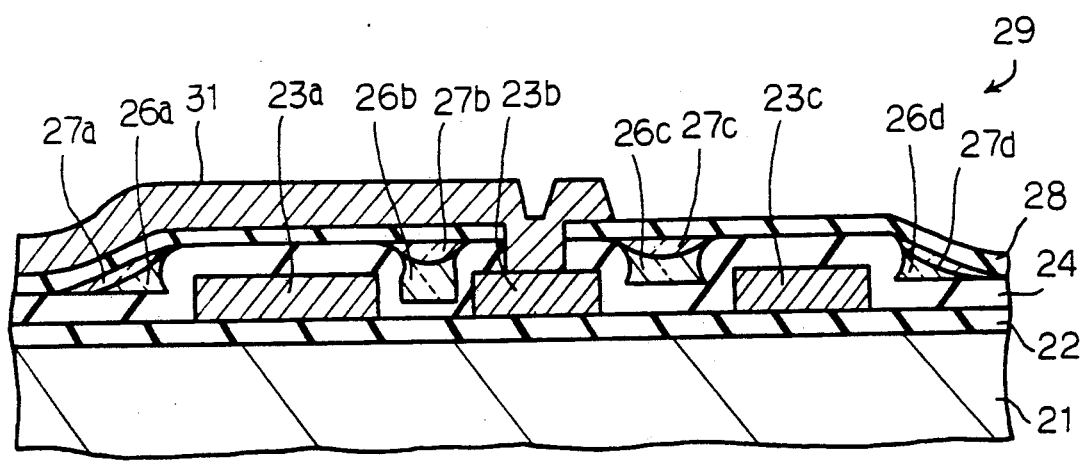

A photoresist solution is spun onto the entire surface of the structure, and the photoresist film is patterned through lithographic process for forming a photomask. Using the photomask, the silicon oxide films 24 and 28 are selectively removed by using a dry etching technique. After the dry etching, a contact hole 30 is formed and penetrates the silicon oxide films 24 and 28. Other contact holes are not shown in the drawings. The contact hole 30 reaches the top surface of the lower-level wiring strip 23b, but no corrosive residual organic glass is left in the contact hole 30. The photomask is stripped off, and the resultant structure of this stage is shown in FIG. 2G. An aluminum-copper alloy is, by way of example, deposited on the entire surface of the structure, and the aluminum-copper alloy is brought into contact with the lower-level wiring strip 23b. An appropriate photomask is formed on the aluminum-copper alloy film thus deposited, and the aluminum-copper alloy film is patterned through lithographic techniques. The aluminum-copper alloy film is formed into upper-level wiring strips, and one of the upper-level wiring strips is designated by reference numeral 31 in FIG. 2H.

Since the bulks 26a to 26d of the corrosive organic glass are coated with the pieces 27a to 27d of the non-corrosive organic glass, the reliability of the upper-level wiring strips is surely improved. Moreover, the narrow valleys such as the valley 25b are filled with the organic glass, and only a small amount of thermal stress is produced in the baking stage. For this reason, a crack seldom takes place, and the upper-level wiring strips are hardly disconnected due to the crack.

Second Embodiment

Turning to FIGS. 3A to 3F of the drawings, another process sequence embodying the present invention is illustrated. The process sequence is similar to that of the first embodiment until bulks 41a, 41b, and 41c and 41d of an organic glass are left in valleys between lower-level wiring strips 42a, 42b and 42c, and, for this reason, detailed description is omitted for the sake of simplicity. Reference numerals 43, 44 and 45 designate a silicon substrate, a thick lower silicon oxide film and a first intermediate silicon oxide film, respectively. The bulks are exposed to an oxygen plasma so that any residual organic glass is deactivated against upper-level metal wiring strips. The organic glass is a silanol compound.

Figure 3A:
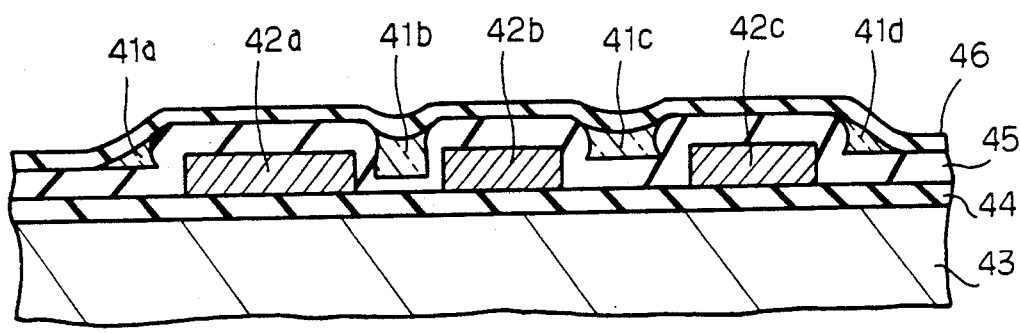
FIGS. 3A to 3F are cross sectional views showing the sequence of another process of fabricating a multi-level wiring structure according to the present invention.

After the formation of the bulks 41a to 41d, a second intermediate silicon oxide film 46 is deposited on the entire surface of the structure by using a chemical vapor deposition technique, and the bulks 41a to 42d are perfectly covered with the second intermediate silicon oxide film 46. Since the bulks 41a to 41d are excessively etched-back, recesses take place in the top surfaces of the bulks 41b and 41c, respectively, and the recesses are transferred to the second intermediate silicon oxide film 46. The resultant structure of this stage is shown in FIG. 3A.

Figure 3B:
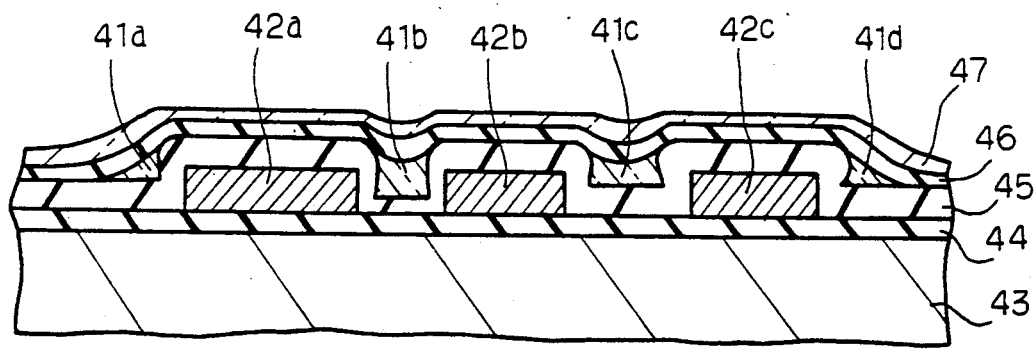
Figure 3C:
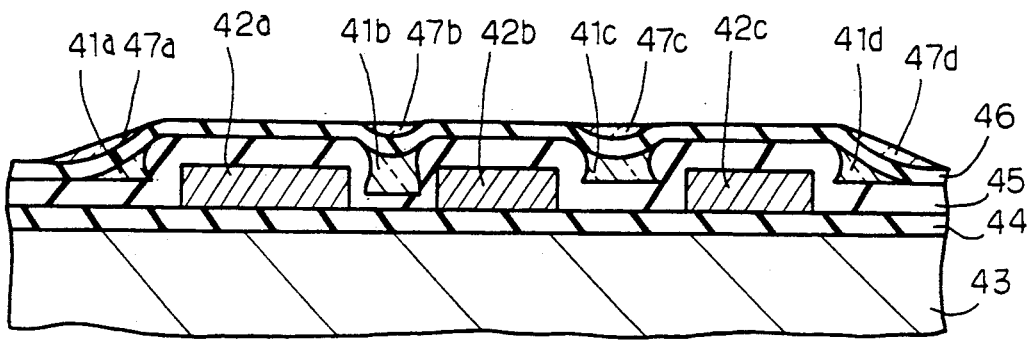
Figure 3D:
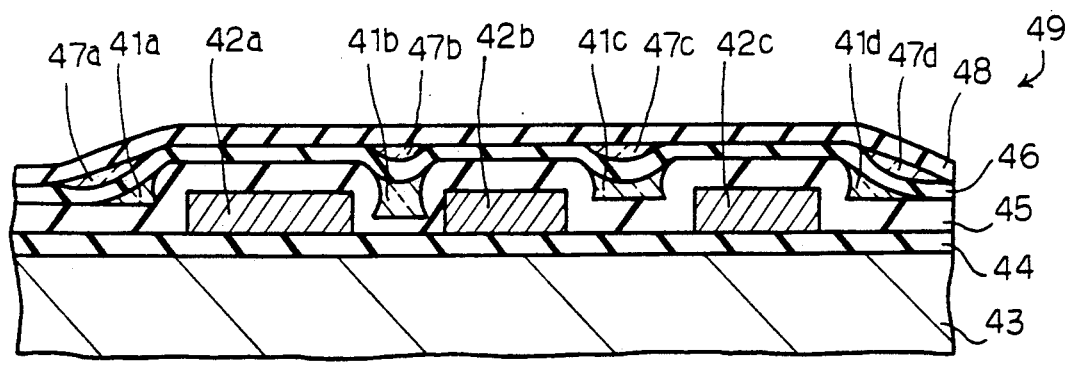

An inorganic glass solution is spun onto the entire surface of the structure, and the inorganic glass solution is baked so that an inorganic glass film 47 is formed on the entire surface as shown in FIG. 3B. The inorganic glass is also a silanol compound.

An etch-back technique is applied to the inorganic glass film 47, and the inorganic glass film 47 is removed until the second intermediate silicon oxide film 46 is exposed. Since the inorganic glass film 47 is not excessively etched-back, pieces 47a, 47b, 47c and 47d of the inorganic glass have respective flat surfaces which are coplanar with the top surface of the second intermediate silicon oxide film 46 as will be seen from FIG. 3C.

Subsequently, a third intermediate silicon oxide film 48 is deposited on the entire surface of the structure by using a chemical vapor deposition technique (see FIG. 3D), and the first, second and third intermediate silicon oxide films 45, 46 and 48, the bulks 41a to 41d of the organic glass and the pieces of the inorganic glass 47a to 47d as a whole constitute an intermediate insulating film structure 49.

Figure 3E:
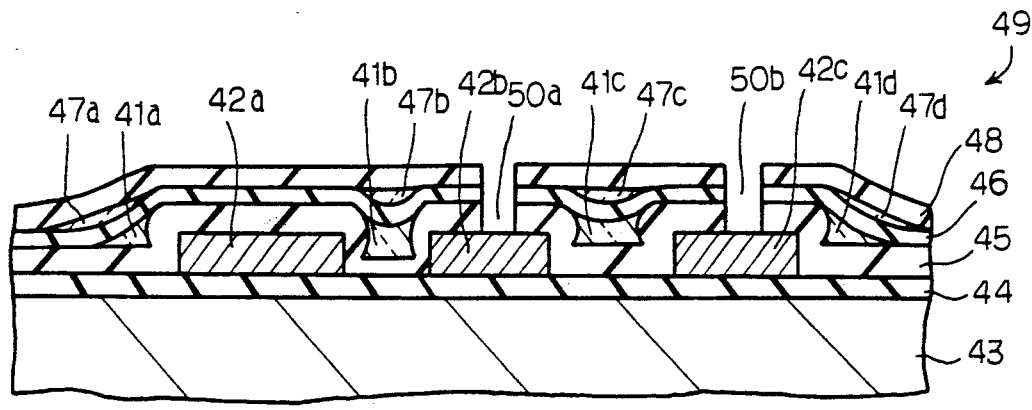

A photomask film (not shown) is formed on the entire surface of the structure, and the photomask film is patterned by using lithographic techniques. The photomask allows predetermined portions of the third intermediate silicon oxide film 48 to be exposed to an etchant, and the first to third intermediate silicon oxide films 45, 46 and 48 are partially removed so that contact holes 49a and 49b are formed in the intermediate insulating film structure 49, reaching the top surfaces of the lower-level wiring strips 42b and 42c as shown in FIG. 3E.

Figure 3F:
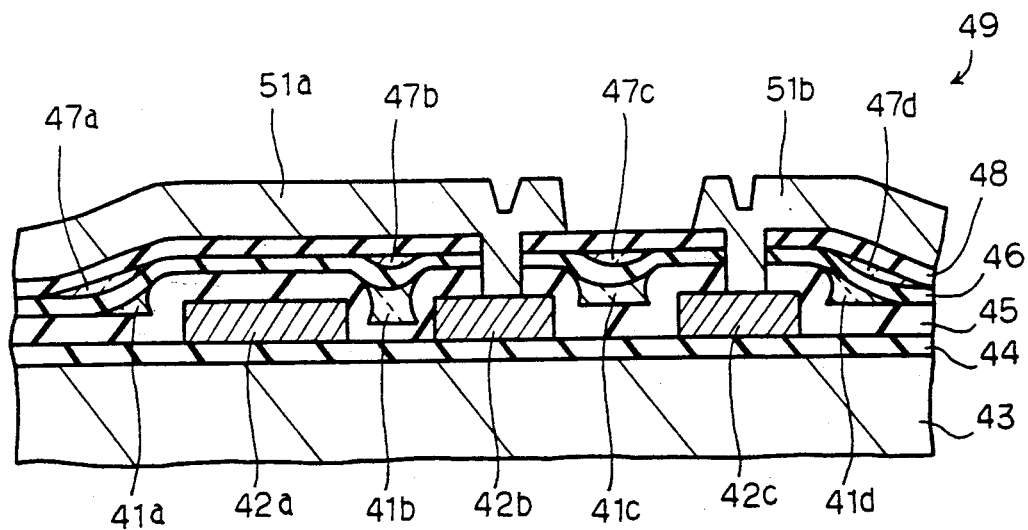

A metal film such as, for example, an aluminum-copper alloy is deposited on the entire surface of the structure, and the metal film is patterned to form upper-level wiring strips 51a and 51b. The upper-level wiring strips 51a and 51b are respectively held in contact with the lower-level wiring strips 42b and 42c as shown in FIG. 3F.

Although particular embodiments of the present invention have been shown and described, it will be obvious to those skilled in the art that various changes and modifications may be made without departing from the spirit and scope of the present invention. For example, another organic glass and another inorganic glass are available as long as the organic glass and the inorganic glass are of the silanol compound. The organic glass film and the inorganic glass film may be formed through another process such as a spray coating.

What is claimed is:

1. A process of fabricating a multi-level wiring structure on a semiconductor substrate covered with a lower insulating film, comprising the steps of:
   a) forming lower-level wiring strips on said lower insulating film;
   b) covering said lower-level wiring strips and exposed portions of said lower insulating film with a first intermediate insulating film, valleys being formed between said lower-level wiring strips;
   c) coating the entire surface with an organic glass film, said valleys being filled with said organic glass film;
   d) removing said organic glass film except for pieces of said organic glass film in said valleys;
   e) coating the entire surface with an inorganic glass film;
   f) removing said inorganic glass film except for pieces of said inorganic glass film on said pieces of said organic glass film;
   g) covering the entire surface with a second intermediate insulating film; and
   h) forming upper-level wiring strips on said second intermediate insulating film.

2. A process as set forth in claim 1, in which said organic glass film and said inorganic glass film are formed through a spin-coating.

3. A process as set forth in claim 2, in which said first and second intermediate insulating films are deposited through a chemical vapor deposition technique.

4. A process as set forth in claim 1, in which said organic glass film is removed by using an etch-back technique continued after said first intermediate insulating film over said lower-level wiring strips is exposed.

5. A process as set forth in claim 1, in which said inorganic glass film is removed using an etch-back technique terminated when said first intermediate insulating film over said lower-level wiring strips is exposed.

6. A process as set forth in claim 1, in which a refining stage is carried out between said step d) and said step e) through an exposure to an oxygen plasma so that any residual organic glass hardly corrodes said upper-level wiring strips, if any.

7. A process as set forth in claim 1, in which said organic and inorganic films are formed of silanol compounds, respectively.

8. A process as set forth in claim 1, in which at least one contact hole is formed in said first and second intermediate insulating films between said step g) and said step h).

9. A process of fabricating a multi-level wiring structure on a semiconductor substrate covered with a lower insulating film, comprising the steps of:
   a) forming lower-level wiring strips on said lower insulating film;
   b) covering said lower-level wiring strips and exposed portions of said lower insulating film with a first intermediate insulating film, valleys being formed between said lower-level wiring strips;
   c) coating the entire surface with an organic glass film, said valleys being filled with said organic glass film;
   d) removing said organic glass film except for pieces of said organic glass film in said valley;
   e) covering the entire surface with a second intermediate insulating film, recesses being formed in said second intermediate insulating film within said valleys;
   f) coating the entire surface with an inorganic glass film;
   g) removing said inorganic glass film except for pieces of said inorganic glass film in said recesses;
   h) covering the entire surface with a third intermediate insulating film; and
   i) forming upper-level wiring strips on said third intermediate insulating film.

10. A process as set forth in claim 9, in which said organic glass film and said inorganic glass film are formed through a spin-coating.

11. A process as set forth in claim 10, in which said first and second intermediate insulating films are deposited through a chemical vapor deposition technique.

12. A process as set forth in claim 9, in which said organic glass film is removed by using an excess etch-back technique continued after said first intermediate insulating film over said lower-level wiring strips is exposed.

13. A process as set forth in claim 12, in which said inorganic glass film is removed using a non-excess etch-back technique terminated when said first intermediate insulating film over said lower-level wiring strips is exposed.

14. A process as set forth in claim 9, in which a refining stage is carried out between said step d) and said step e) through an exposure to an oxygen plasma so that any residual organic glass hardly corrodes said upper-level wiring strips, if any.

15. A process as set forth in claim 9, in which said organic and inorganic films are formed of silanol compounds, respectively.

16. A process as set forth in claim 9, in which a plurality of contact holes are formed in said first, second and third intermediate insulating films between said step h) and said step i).

* * * * *